(12) United States Patent
Wei et al.

(10) Patent No.: US 8,742,513 B2
(45) Date of Patent: Jun. 3, 2014

(54) SEMICONDUCTOR DEVICE COMPRISING METAL GATES AND A SILICON CONTAINING RESISTOR FORMED ON AN ISOLATION STRUCTURE

(71) Applicant: GLOBALFOUNDRIES Inc., Grand Cayman (KY)

(72) Inventors: Andy Wei, Dresden (DE); Andrew Waite, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/628,468

(22) Filed: Sep. 27, 2012

(65) Prior Publication Data

US 2013/0026581 A1 Jan. 31, 2013

Related U.S. Application Data

(62) Division of application No. 12/759,785, filed on Apr. 14, 2010, now Pat. No. 8,298,885.

(30) Foreign Application Priority Data

May 15, 2009 (DE) .......................... 10 2009 021 485

(51) Int. Cl.
*H01L 27/11* (2006.01)
(52) U.S. Cl.
USPC ..... 257/374; 257/379; 257/380; 257/E27.035
(58) Field of Classification Search
USPC .................. 257/374, 379, 380, 538, E27.035, 257/E27.047
See application file for complete search history.

(56) References Cited

U.S. PATENT DOCUMENTS

| | | | |
|---|---|---|---|
| 6,333,233 B1 | 12/2001 | Moriwaki et al. | 438/241 |
| 6,406,956 B1 * | 6/2002 | Tsai et al. | 438/201 |
| 7,648,884 B2 * | 1/2010 | Min et al. | 438/385 |
| 2008/0173934 A1 | 7/2008 | Lee et al. | 257/327 |
| 2008/0206939 A1 | 8/2008 | Min et al. | 438/197 |
| 2009/0020828 A1 | 1/2009 | Yamada | 257/379 |
| 2009/0039423 A1 | 2/2009 | Ikeda | 257/334 |
| 2009/0090977 A1 | 4/2009 | Freeman et al. | 257/379 |
| 2009/0117726 A1 | 5/2009 | Pas | 438/592 |
| 2010/0052058 A1 | 3/2010 | Hsu et al. | 257/364 |

FOREIGN PATENT DOCUMENTS

DE 102008030852 A1 1/2010 ............. H01L 29/78

OTHER PUBLICATIONS

Translation of Official Communication from German Patent Office for German Patent Application No. 10 2009 021 485.2-33 dated Mar. 22, 2010.
PCT Search Report and Written Opinion from PCT/US2010/033967 dated Aug. 31, 2010.

* cited by examiner

*Primary Examiner* — Minh-Loan T Tran
(74) *Attorney, Agent, or Firm* — Amerson Law Firm, PLLC

(57) ABSTRACT

In a semiconductor device comprising sophisticated high-k metal gate structures formed in accordance with a replacement gate approach, semiconductor-based resistors may be formed above isolation structures substantially without being influenced by the replacement gate approach. Consequently, enhanced area efficiency may be achieved compared to conventional strategies, in which the resistive structures may have to be provided on the basis of a gate electrode metal, while, nevertheless, a low parasitic capacitance may be accomplished due to providing the resistive structures above the isolation structure.

12 Claims, 6 Drawing Sheets

SEMICONDUCTOR DEVICE COMPRISING METAL GATES AND A SILICON CONTAINING RESISTOR FORMED ON AN ISOLATION STRUCTURE

CROSS-REFERENCE TO RELATED APPLICATION

This is a divisional of co-pending application Ser. No. 12/759,785, filed Apr. 14, 2010.

BACKGROUND OF THE INVENTION

1. Field of the Invention

The present disclosure generally relates to the field of fabricating integrated circuits, and, more particularly, to resistors formed above isolation structures in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit element in highly complex integrated circuits and substantially determine the overall performance of these devices, other components, such as capacitors and resistors, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay. For example, in sophisticated applications, resistors may frequently be provided in the form of "integrated polysilicon" resistors, which may be formed above isolation structures so as to obtain the desired resistance value without significantly contributing to parasitic capacitance, as may be the case in "buried" resistive structures which may be formed within the active semiconductor layer. A typical polysilicon resistor may thus require the deposition of the basic polysilicon material, which may frequently be combined with the deposition of a polysilicon gate electrode material for the transistor elements. During the patterning of the gate electrode structures, the resistors may also be formed, the size of which may significantly depend on the basic specific resistance value of the polysilicon material and the subsequent type of dopant material and concentration that may be incorporated into the resistors to adjust the resistance values. Since, typically, the resistance value of doped polysilicon material may be a non-linear function of the dopant concentration, specific implantation processes are typically required, independent of any other implantation sequences for adjusting the characteristics of the polysilicon material of the gate electrodes of the transistors, which may thus result in a moderately high complex manufacturing sequence.

Moreover, the continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called "PN junctions" that are formed by an interface of highly doped regions, referred to as "drain" and "source" regions, with a slightly doped or non-doped region, referred to as a "channel" region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as "channel length."

Presently, most of the complex integrated circuits are based on silicon, due to the substantially unlimited availability, the well understood characteristics of silicon and related materials and processes, and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called "short channel" behavior, according to which a variability in channel length may have a significant influence on the resulting threshold voltage of the transistor. Aggressively scaled transistor devices with a relatively low supply voltage and, thus, a reduced threshold voltage, therefore, suffer from a significant increase of the leakage current caused by the reduced thickness of a silicon dioxide gate dielectric. For example, a channel length of approximately 0.08 μm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, wherein transistor elements with a longer channel may be used for less critical signal paths (for instance, such less critical transistors may be used as storage transistors), the relatively high leakage current caused by the direct tunneling of charge carriers through the ultra-thin silicon dioxide gate dielectric of the high speed transistor elements may reach values for an oxide thickness in the range of 1-2 nm and may no longer be compatible with thermal design power requirements for any type of complex integrated circuit system.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with gate dielectric material, the presence of a depletion zone may, thus, be avoided, while, at the same time, a moderately high conductivity may be achieved.

As is well known, the threshold voltage of the transistor may depend on the overall transistor configuration, on the complex lateral and vertical dopant profile of the drain and source regions, the corresponding configuration of the PN junctions and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, the high-k dielectric material may be formed in combination with an appropriate metal-containing cap layer, such as titanium nitride and the like, followed by the deposition of a polysilicon material in combination with other materials, if required, which may then be patterned in order to form a gate electrode structure. Concurrently, corresponding resistors may be patterned, as described above. Thereafter, the basic transistor configuration may be completed by forming drain and source regions, performing anneal processes and finally embedding the transistors in a dielectric material. Thereafter, an appropriate etch sequence may be performed, in which the top surfaces of the gate electrode structures, and all resistive structures, may be exposed and the polysilicon material may be removed. Thereafter, based on a respective masking regime, appropriate metal-containing electrode materials may be filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors and P-channel transistors, respectively. Concurrently, the resistive structures may also receive the metal-containing electrode material. Due to the enhanced conductivity of the metal-containing electrode material, however, the resistivity of the resistive structures may also exhibit a significantly reduced value, thereby requiring a reduction of line widths of these structures and/or an increase of the total length of these structures. While the former measure may result in patterning problems, as some extremely small line widths may be required, the latter aspect possibly results in an increased consumption of valuable chip area. For this reason, in some conventional approaches, the resistive structures may be formed in the active semiconductor material, instead of providing the resistive structures above the isolation structures patterned concurrently with the gate electrode structures of the transistors, which, however, may result in reduced performance due to an increased parasitic capacitance of these resistive structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for manufacturing the same in which integrated resistor elements may be formed on the basis of any appropriate semiconductor material, such as a silicon material, a silicon/germanium material, a germanium material and the like, while sophisticated metal gate structures may be provided for the transistors. For this purpose, the gate electrode structures may be provided on the basis of a desired semiconductor material as is to be used for the resistors and the semiconductor material may be replaced by one or more metal-containing electrode materials in a very advanced manufacturing stage, while the resistors are appropriately masked in order to substantially preserve the semiconductor material therein. Consequently, a so-called "replacement gate" approach may be efficiently applied in order to obtain sophisticated high-k metal gate stacks, while at the same time semiconductor-based resistive structures may be formed on the isolation structure, thereby providing a superior capacitive behavior of the resistive structure, while not unduly consuming valuable chip area. In some illustrative embodiments, the concurrent provision of a complex metal gate stack in combination with a semiconductor-based resistive structure may be accomplished without adding additional process complexity, for instance, in terms of additional photolithography steps, since the masking of the resistive structure in a late manufacturing stage may be compensated for, or even over-compensated for, by avoiding a corresponding masking of the resistive structure prior to the formation of a meal silicide material in the drain and source regions of the transistor. Furthermore, the semiconductor material, such as a polysilicon material, may be provided with an appropriate dopant level and dopant type at an initial stage of the manufacturing process, thereby also avoiding any additional masking steps which may typically have to be provided in conventional strategies when polysilicon gates, in combination with polysilicon resistive structures, are provided. Furthermore, in some illustrative aspects disclosed herein, the manufacturing of semiconductor-based resistive structures may be advantageously incorporated into a manufacturing flow for enhancing transistor performance by applying one or more additional performance enhancing mechanisms, such as providing stress-inducing dielectric layers above the transistor configurations and/or forming an embedded strain-inducing semiconductor alloy in at least one type of transistor.

One illustrative semiconductor device disclosed herein comprises a transistor element comprising a gate electrode structure that includes a high-k gate dielectric material and a metal-containing electrode material formed above the high-k gate dielectric material. Moreover, a resistor is formed above an isolation structure and comprises a doped semiconductor material.

One illustrative method disclosed herein relates to the formation of a resistive structure of a semiconductor device. The method comprises forming a layer stack above a transistor region and a resistor region of the semiconductor device, wherein the layer stack comprises a high-k dielectric material, a metal-containing cap material and a semiconductor material. Furthermore, the resistor region comprises an isolation structure. Additionally, the method comprises adjusting a dopant level in the semiconductor material so as to obtain a target resistivity for the resistive structure. Additionally, the method comprises forming a replacement gate electrode structure in the transistor region and forming the resistive structure in the resistor region above the isolation structure on the basis of the layer stack. Finally, the method comprises replacing the semiconductor material selectively in the replacement gate electrode structure while substantially preserving the semiconductor material in the resistive structure.

A further illustrative method disclosed herein comprises forming a replacement gate electrode structure above an active semiconductor region and forming a resistive structure above an isolation structure, wherein the replacement gate electrode structure and the resistive structure comprise a semiconductor material having a specified dopant level to achieve a target resistance value for the resistive structure. The method further comprises forming a mask so as to cover the resistive structure and expose the replacement gate electrode structure. Further, the method comprises removing the semiconductor material selectively from the replacement gate electrode structure and forming a metal-containing electrode material above the replacement gate electrode structure and the resistive structure. Finally, the method comprises removing excess material of the metal-containing electrode material so as to provide a metal gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
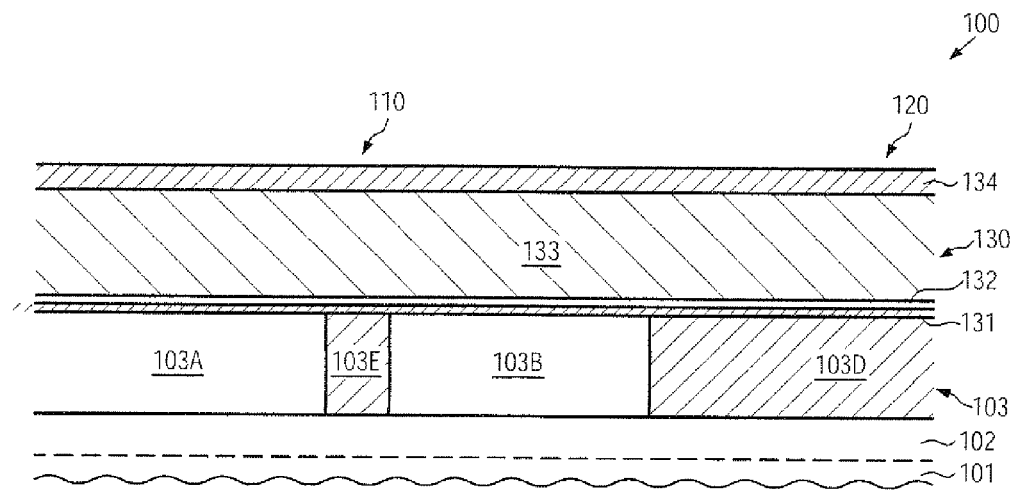
FIG. 1a schematically illustrates a cross-sectional view of a semiconductor device in an early manufacturing stage, in which a layer stack comprising a high-k dielectric material and a semiconductor material may be formed above a transistor region and a resistor region, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and methods for forming the same in which resistor elements may be formed on the basis of a semiconductor material, such as silicon, silicon/germanium and the like, in combination with complex metal-containing gate electrode structures of transistors, wherein the resistive structures may be formed on isolation structures in order to obtain superior performance with respect to parasitic capacitance. According to the principles disclosed herein, the manufacturing sequence for creating the transistor configurations may be based on the semiconductor material, which may comprise an appropriate dopant species that results in a desired doping level, so as to first form a replacement gate electrode structure and the resistive structure. In an advanced manufacturing stage, the semiconductor material may be selectively replaced in the gate electrode structures by appropriately selected metal-containing electrode materials, while, on the other hand, the semiconductor material may be preserved in the resistive structure. In some illustrative aspects disclosed herein, dedicated masking steps for avoiding silicidation in the semiconductor material during the process of forming a metal silicide in drain and source regions of the transistors may be avoided, thereby contributing to an enhanced overall manufacturing flow. After completing the basic transistor configuration, masking may be applied so as to selectively expose the semiconductor material in the replacement gate electrode structures to an etch ambient in order to remove the semiconductor material therein and form an appropriate work function adjusting metal-containing material in combination with an electrode material. Moreover, in some illustrative aspects disclosed herein, the provision of the semiconductor-based resistive structures may further be compatible with the incorporation of additional performance-enhancing mechanisms, such as the provision of stress-inducing dielectric materials above the transistors, embedding a strain-inducing semiconductor alloy and the like. Consequently, compared to conventional strategies, a low capacitance semiconductor-based resistor may be formed on top of an isolation structure, thereby avoiding undue patterning related problems and/or consumption of chip area, which may typically be encountered in conventional strategies, in which the semiconductor material of the resistive structures may be replaced together with the semiconductor material of the replacement gate electrode structures.

FIG. 1a schematically illustrates a cross-sectional view of a semiconductor device 100 comprising a substrate 101, above which may be formed a semiconductor layer 103. The substrate 101 may represent any appropriate carrier material for forming thereabove the semiconductor layer 103. As previously explained, the semiconductor layer 103 may represent a silicon-based material, which may also comprise other components, such as germanium, carbon and the like, in addition to specific dopant species, which may already be present in the semiconductor layer 103 or which may be incorporated therein in a later manufacturing stage. It should be appreciated, however, that the principles disclosed herein may also be applied to other semiconductor materials, such as germanium, semiconductor compounds and the like. Furthermore, the device 100 may represent a "bulk" configuration, in which the semiconductor layer 103 may represent a portion of a crystalline substrate material of the substrate 101. In other cases, a buried insulating layer 102 may be provided between the substrate 101 and the semiconductor layer 103, at least in some device regions, thereby forming a silicon-on-insulator (SOI) configuration. Furthermore, in the semiconductor layer 103, appropriate isolation structures 103E, 103D may be formed, for instance, on the basis of silicon dioxide, silicon nitride or any other desired insulating materials. In the embodiment shown, the semiconductor layer 103 may be considered as comprising a first device region 110, which may also be referred to as a transistor region, and a second device region 120, which may also be referred to as a resistor region, and which may be substantially defined by the isolation structure 103D. Furthermore, the transistor region 110 may comprise active regions 103A, 103B, possibly separated by the isolation structure 103E, wherein an active region may be understood as a semiconductor region of the layer 103, in and above which at least one transistor element is to be formed. For example, the active region 103A may have an appropriate base doping that may be compatible with the fabrication of an N-channel transistor, while the active region 103B may represent the active region of a P-channel transistor.

Furthermore, in the manufacturing stage shown in FIG. 1a, a layer stack 130 may be formed above the transistor region 110 and the resistor region 120, and may comprise a gate dielectric layer 131, a metal-containing cap layer 132, a semiconductor material 133 and a dielectric cap layer 134. As discussed above, the gate dielectric material 131 may comprise a high-k dielectric material, for instance, one of the materials as previously described, wherein, if required, additionally, any other "conventional" dielectric material may be provided in the layer 131. For example, the gate dielectric material 131 may comprise a very thin silicon dioxide layer followed by a high-k dielectric material. Irrespective of the configuration of the layer 131, this layer may be referred to as a high-k dielectric material herein, as long as a dielectric material having a dielectric constant of approximately 10.0 or higher is incorporated in the layer 131. The metal-containing cap layer 132 may be directly formed on the layer 131 and may act as a cap layer for further processing of the device 100 and may also represent a metal-containing electrode material in combination with at least one further metal-containing material that is to be provided in a later manufacturing stage. For example, the cap layer 132 may be comprised of titanium nitride and the like. For example, the gate dielectric material 131 may be provided with a thickness in the range of 1.5 to several nm, depending on the overall device requirements, while the metal-containing cap layer 132 may have a thickness of 1 to several nm. Depending on the type of material used for the layer 132 and the thickness thereof, a corresponding sheet resistance may, in some illustrative embodiments, be taken into consideration when forming a resistive structure in the resistor region 120 by appropriately adapting the dopant level of the semiconductor material 133. For instance, if an overall moderately low resistivity of the resistive structure is to be achieved in illustrative embodiments, the layers 131 and 132 may be preserved in the resistive structure and a specific adaptation of the dopant level may be performed while taking into consideration the resistivity of the layer 132. For example, a titanium nitride layer with a thickness of between 1-2 nm may have a sheet resistivity of several hundred Ohm μm. In other illustrative embodiments, as will be described later on in more detail, at least the layer 132 may be removed or otherwise modified selectively in the region 120, where a corresponding sheet resistivity of the layer 132 is considered inappropriate for a resistive structure. Consequently, according to some illustrative embodiments, an internal dopant level of the semiconductor material 133 may be appropriately selected in order to obtain the desired target resistivity of layer stack 130. For instance, the semiconductor material 133 may be comprised of silicon material in a polycrystalline state or in an amorphous state, which may be converted into a polycrystalline state during the further processing. In other cases, if increased dopant levels may have to be provided for a silicon-based material, a certain amount of germanium may be incorporated into the material 133 in order to reduce the overall base sheet resistivity, if considered appropriate. It should be appreciated that the characteristics of the semiconductor material 133 may be specifically designed with respect to the resistive structure still to be formed in the resistor region 120, without requiring a difference between the regions 110 and 120, since the material 133 may be removed from the region 110 in a later manufacturing stage. In some illustrative embodiments, the semiconductor material 133 may be provided as an N-doped silicon material or an N-doped silicon/germanium mixture, which may be advantageous in view of a chemical removal process, since some chemical agents may provide enhanced process conditions for removing an N-doped silicon-based material compared to a P-doped silicon material. Furthermore, the cap layer 134 may be provided, for instance, with respect to patterning the layer stack 130, acting as a cap material during the further processing, as will be described with reference to FIG. 1b. For example, the layer 134 may be provided in the form of a silicon nitride material, possibly in combination with other materials, such as silicon dioxide and the like.

The semiconductor device 100 as illustrated in FIG. 1a may be formed on the basis of the following processes. After forming the isolation structures 103E, 103D in the semiconductor layer 103, which may be accomplished by well-established sophisticated lithography techniques, etch processes, deposition processes, planarization processes and the like, the basic doping of the active regions 103A, 103B may be established by well-approved implantation techniques. Thereafter, the gate dielectric material 131 may be formed, for instance, on the basis of sophisticated oxidation techniques, such as thermal oxidation, chemical oxidation and the like, when the layer 131 may be formed on the basis of a conventional silicon dioxide-based material. Thereafter, a desired high-k dielectric material may be deposited, such as hafnium oxide and the like, with a desired thickness, followed by the deposition of the metal-containing cap layer 132, thereby confining the sensitive high-k dielectric material in the layer 131. Next, the semiconductor material 133 may be deposited, for instance, by low pressure chemical vapor deposition (CVD) and the like, wherein, in one illustrative embodiment, the material 133 may be deposited as an in situ doped semiconductor material, that is, the desired concentration of a dopant species may be added to the deposition ambient in order to provide the desired doping level. Thereafter, the one or more cap layers 134 may be deposited by any appropriate deposition technique. In other illustrative embodiments, the desired dopant level in the material 133 may be obtained on the basis of an implantation process that may be performed as a non-masked implantation process in order to incorporate a dopant concentration as may be required for the resistive structures to be formed in the device region 120. The implantation process may be performed prior to or after the deposition of the cap layer 134.

Figure 1B:
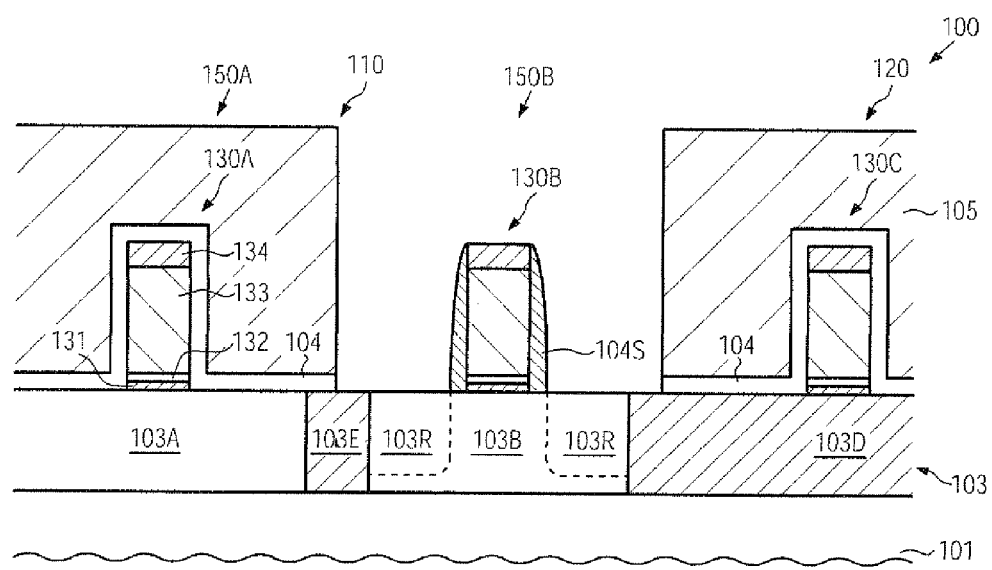
FIG. 1b schematically illustrates a cross-sectional view of a semiconductor device, according to illustrative embodiments, in which replacement gate electrode structures are formed above the transistor regions and a resistive structure is formed above the resistor region and wherein one of the transistors is to receive a strain-inducing semiconductor alloy.

FIG. 1b schematically illustrates a cross-sectional view of the semiconductor device 100 in a further advanced manufacturing stage, according to illustrative embodiments, in which at least one type of transistor may receive an embedded strain-inducing semiconductor alloy in order to enhance overall performance of the transistor, as is also discussed above. As illustrated, gate electrode structures 130A, 130B are formed above the active regions 103A, 103B, while a resistor or resistive structure 130C may be formed above the isolation structure 103D. The gate electrode structures 130A, 130B may also be referred to as "replacement gate electrode structures," since the semiconductor material 133 may be removed in a later manufacturing stage. In the embodiments shown, a mask layer 104, for instance, comprised of silicon nitride and the like, may be formed so as to cover the gate electrode structure 130A and the resistive structure 130C, while the electrode structure 130B may have formed on the sidewalls thereof a spacer element 104S. Additionally, an etch mask, such as a resist mask 105, may be formed above the device 100 so as to cover a transistor 150A, i.e., the active region 103A, and the electrode structure 130A, while exposing a transistor 150B, i.e., the active region 103B and the electrode structure 130B. Furthermore, the resistive structure 130C may also be covered by the mask 105.

The semiconductor device 100 as illustrated in FIG. 1b may be formed on the basis of the following processes. The layer stack 130 (see FIG. 1a) may be patterned on the basis of sophisticated lithography and etch techniques in compliance with corresponding design rules for obtaining a desired length of the gate electrode structures 130A, 130B and to obtain a desired line width for the resistive structure 130C. Thereafter, the mask layer 104 may be deposited, for instance, by thermally activated CVD techniques in the form of a silicon nitride material, thereby reliably confining the sensitive material 131 at sidewalls of the gate electrode structures 130A, 130B and the resistive structure 130C. In some illustrative embodiments, a thickness and the material characteristics of the mask layer 104 may be selected so as to provide a desired offset of cavities 103R to be formed in the active region 103B in order to form therein an embedded strain-inducing semiconductor alloy. Moreover, the width and material characteristics of the mask layer 104 may also be selected so as to act as offset spacers, possibly in combination with an additional material, in order to form drain and source extension regions via ion implantation in a further advanced manufacturing stage. After the deposition of the mask layer 104, the etch mask 105 may be formed, for instance, on the basis of well-established lithography techniques. Next, an anisotropic etch process may be performed so as to etch the exposed portion of the mask layer 104, thereby obtaining the sidewall spacer 104S of the gate electrode structure 130B. Next, the etch chemistry may be appropriately adapted so as to etch into the active region 103B, in order to form the cavities 103R.

Figure 1C:
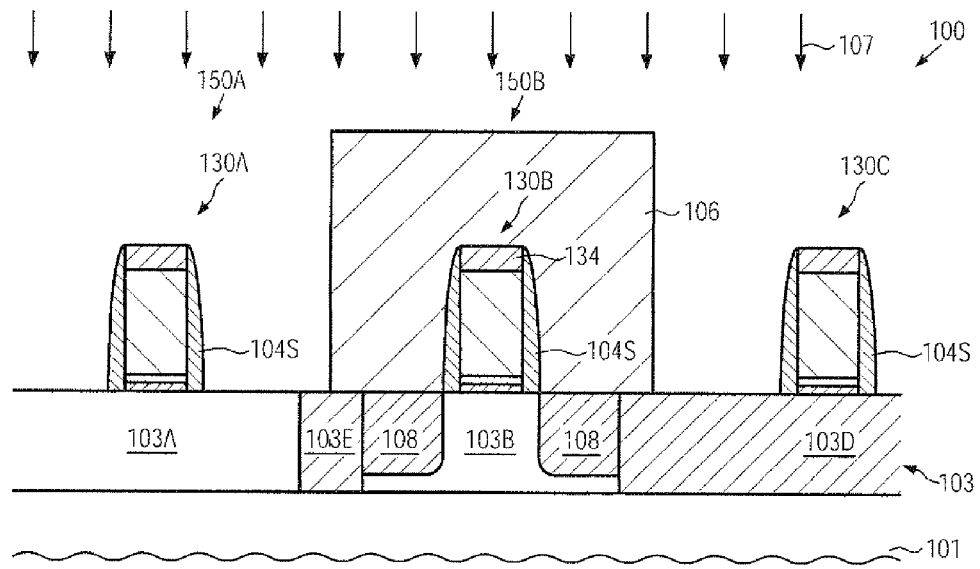
FIGS. 1c-1e schematically illustrate cross-sectional views of the semiconductor device during various manufacturing stages in completing the basic transistor configuration on the basis of a replacement gate electrode structure, according to illustrative embodiments.

FIG. 1c schematically illustrates the semiconductor device 100 in a further advanced manufacturing stage. As shown, the transistor 150B may comprise a strain-inducing semiconductor alloy 108, which may be provided in the form of a silicon/germanium alloy, a silicon/carbon alloy, a silicon/germanium/tin alloy and the like, depending on the type of strain to be induced. For example, the material 108 may represent a silicon/germanium alloy wherein the compressive strain is considered advantageous for enhancing performance of the transistor 150B. Furthermore, sidewall spacers 104S may also be formed on the sidewalls of the electrode structure 130A and the resistive structure 130C.

The device 100 as illustrated in FIG. 1c may be formed on the basis of the following processes. After forming the cavities 103R (FIG. 1b), the etch mask 105 (FIG. 1b) may be removed and the device 100 may be prepared for the deposition of the strain-inducing semiconductor material 108. Thereafter, a selective epitaxial growth process may be performed on the basis of well-established process recipes, wherein a significant material deposition may be restricted to exposed areas of the active region 103B. In some illustrative embodiments, the further processing may be continued by forming a mask 106 that may cover the transistor 150B while exposing the transistor 150A and the resistive structure 130C. In other illustrative embodiments (not shown), the mask layer of FIG. 1b in combination with the spacer 104 and the cap layers 134 may be removed, if considered appropriate. In the embodiment shown, however, an etch process 107 may be performed so as to obtain the spacer elements 104S, which may be used in the further processing, as discussed above.

It should be appreciated that the gate electrode structures 130A, 130B in combination with the resistive structure 130C may also be formed without providing the semiconductor alloy 108, in which case the spacer elements 104S may be commonly formed for each of the components 150A, 150B and 130C.

Figure 1D:
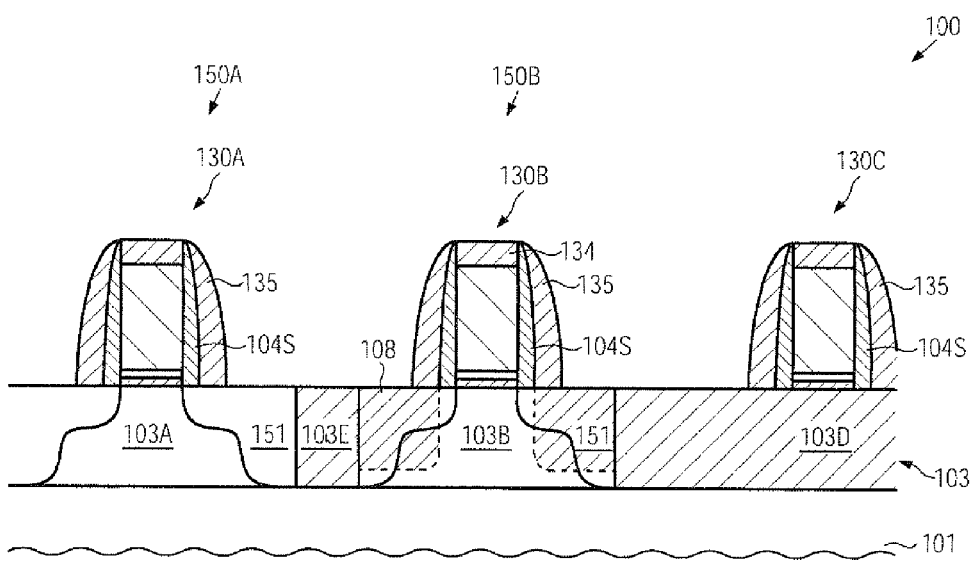

FIG. 1d schematically illustrates the semiconductor device 100 in a further advanced manufacturing stage in which the transistors 150A, 150B may comprise drain and source regions 151, possibly in combination with the strain-inducing semiconductor alloy 108 in the transistor 150B, as described above. Moreover, the gate electrode structures 130A, 130B and the resistive structure 130C may comprise an additional spacer structure 135, which may be comprised of any appropriate material combination, for instance, a silicon dioxide material in combination with silicon nitride and the like.

The semiconductor device 100 may be formed on the basis of a process sequence, wherein drain and source extension regions may be formed by ion implantation, in which the spacers 104S may be used as efficient offset spacer elements. Furthermore, as previously described, typically, complex dopant profiles may be required, so that so-called "halo" implantation regions, or counter-doped regions, may be formed in the vicinity of the PN junction of the drain and source regions 151 in order to obtain a desired dopant profile and gradient in accordance with transistor requirements. Thereafter, the spacer structure 135 may be formed on the basis of well-established techniques and, subsequently, further implantation processes may be performed in order to obtain the drain and source regions 151. Thereafter, the dopants may be activated and implantation-induced damage may be re-crystallized by performing one or more appropriate anneal processes.

Figure 1E:
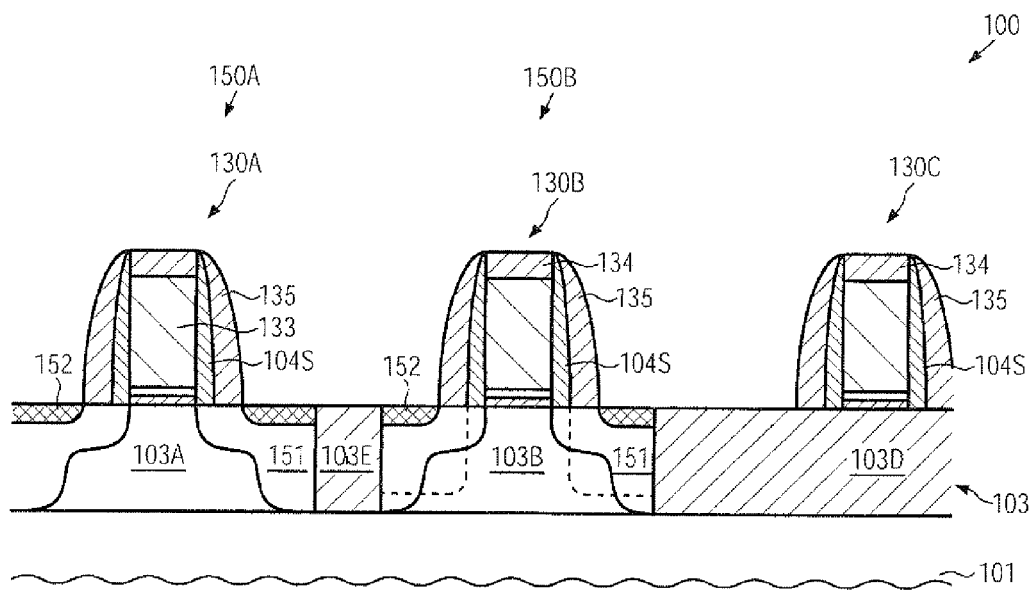

FIG. 1e schematically illustrates the semiconductor device 100 in a manufacturing stage in which metal silicide regions 152 may be formed in the drain and source regions 151 of the transistors 150A, 150B. In the embodiment shown, the cap layer 134 may still be present in the gate electrode structures 130A, 130B and in the resistive structure 130C. Consequently, during a corresponding silicidation process, any appropriate refractory metal, such as nickel, platinum and the like, may be deposited, and may be subsequently heat treated for initiating a chemical reaction with a silicon species, wherein the semiconductor material 133 of the structures 130A, 130B and 130C may be preserved by the cap layer 134. Consequently, a corresponding silicidation strategy may be specifically designed such that superior conditions may be obtained for forming the metal silicide regions 152. Moreover, due to the presence of the cap layer 134, a silicidation of the resistive structure 130C may be reliably avoided so that, in some illustrative embodiments, a specifically designed mask layer may not be necessary, when a silicidation of the resistive structure 130C may be undesirable due to the superior conductivity of the metal silicide material compared to the semiconductor 133. Hence, in conventional approaches, an appropriate silicidation mask may be provided which may, for instance, be aligned so as to define contact areas while covering the actual resistive body of the corresponding resistive structure. In the embodiment shown, corresponding contact areas may be provided by the material 133 without a metal silicide, thereby contributing to enhanced overall process efficiency and process uniformity.

Figure 1F:
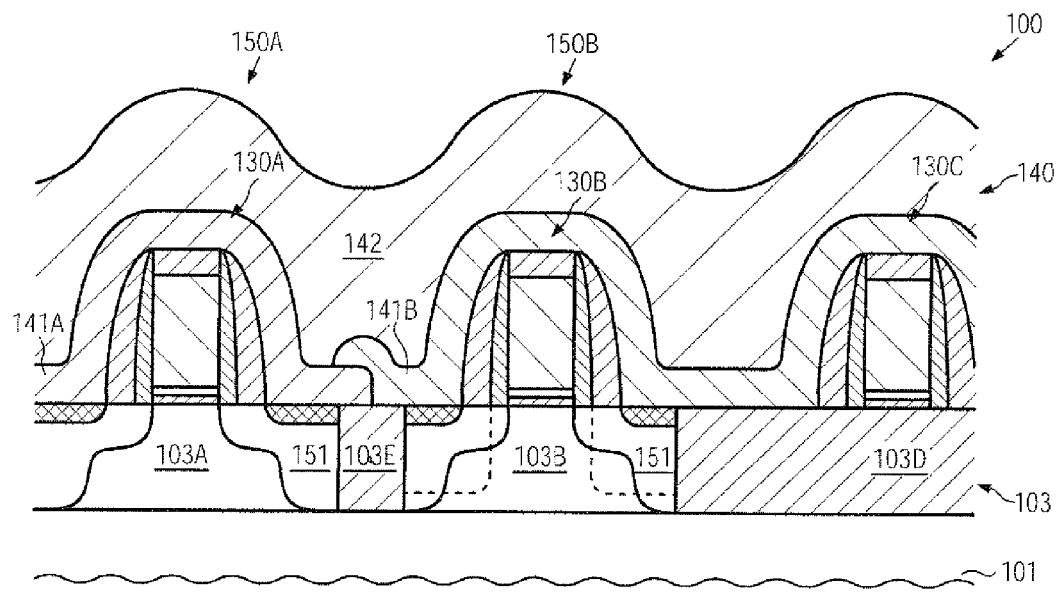
FIGS. 1f-1j schematically illustrate the semiconductor device during various manufacturing stages in providing at least a portion of an interlayer dielectric material and replacing the semiconductor material selectively in the replacement gate electrode structures, while preserving the semiconductor material in the resistive structure, according to illustrative embodiments.

FIG. 1f schematically illustrates the semiconductor device 100 in a state in which at least a portion of an interlayer dielectric material 140 may be formed above the transistors 150A, 150B and the resistive structure 130C. For example, the interlayer dielectric material 140 may comprise, in some illustrative embodiments, a stress-inducing dielectric layer 141A formed above the transistor 150A and a second stress-inducing dielectric layer 141B formed above the transistor 150B, wherein one of the layers 141A, 141B may also be formed above the resistive structure 130C. As previously indicated, performance of transistors may be increased by generating a specific type of strain therein. Since layers 141A, 141B are positioned very close to the transistors 150A, 150B, respectively, a high internal stress level of these layers may, thus, enhance performance of the transistors 150A, 150B. In the embodiment shown, the layers 141A, 141B may provide different types of internal stress, such as a tensile stress for the transistor 150A and a compressive stress for the transistor 150B, when representing an N-channel transistor and a P-channel transistor, respectively. As previously described, the transistor 150B may also comprise the strain-inducing semiconductor alloy 108 (FIG. 1d), if required. In other cases, the layers 141A, 141B may be provided with different stress levels, such as a highly compressive or tensile stressed layer in combination with a substantially stress-neutral layer, depending on the overall process strategy. Furthermore, the material 140 may comprise a fill material 142, such as a silicon dioxide material, which may be deposited on the basis of any appropriate deposition technique. The material 140 may be provided so as to reliably fill any spaces between the transistors 150A, 150B and the resistive structure 130C.

Figure 1G:
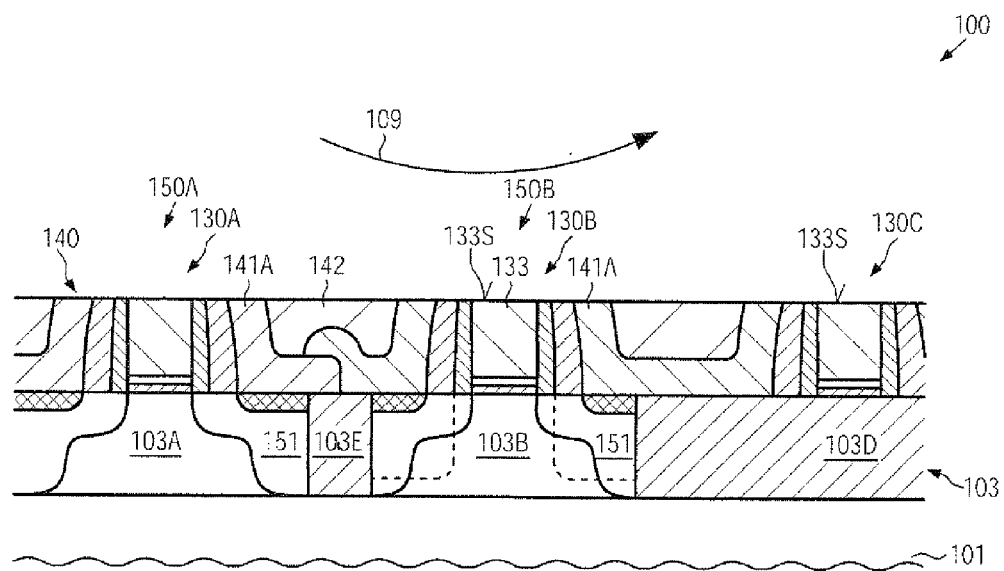

FIG. 1g schematically illustrates the semiconductor device 100 during a material removal process 109, during which the interlayer dielectric material 140 may be planarized. For example, in some illustrative embodiments, the material removal process 109 may comprise a chemical mechanical polishing (CMP) process or sequence, in which, in a first step, material of the layer 142 may be removed, wherein well-established process recipes may be applied, which may exhibit a certain degree of selectivity with respect to the material of the layers 141A, 141B, if required. Consequently, upon exposing the materials 141A, 141B, a different polishing recipe, for instance, a different type of slurry material, may be used so as to achieve substantially the same removal rate for the materials 142 and 141A, 141B. Hence, during the process 109, surface areas 133S of the semiconductor material 133 in the gate electrode structures 130A, 130B, and in the resistive structure 130C, may be exposed.

Figure 1H:
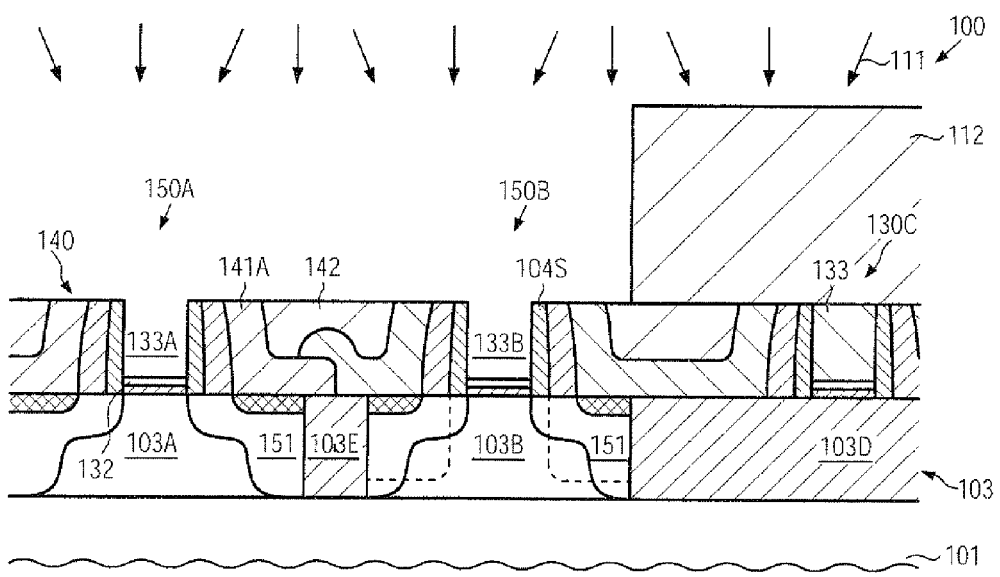

FIG. 1h schematically illustrates the semiconductor device 100 in a further advanced manufacturing stage, in which the resistive structure 130C may be covered by an etch mask 112, for instance, provided in the form of a resist mask or any other appropriate material. The mask 112 may be formed in accordance with any well-established lithography techniques on the basis of the planarized surface obtained by the material removal process 109 (FIG. 1g). Moreover, the semiconductor device 100 may be exposed to an etch ambient 111 that may be designed to remove the semiconductor material 133 (FIG.

1g) selectively to the interlayer dielectric material 140 and to the sidewall spacers 104S. Consequently, during the etch process, openings 133A, 133B may be formed in the transistors 150A, 150B. The etch process 111 may, for instance, be performed as a wet chemical etch process, for instance, by using hydrofluoric acid (HF) as an etch chemistry for removing any native oxide that may have formed on the semiconductor material 133, for instance, if the material 133 may comprise a significant amount of silicon. Thereafter, any appropriate wet chemical or plasma-assisted etch recipe may be used. For instance, in some illustrative embodiments, corresponding basic solutions, for instance in the form of potassium hydroxide and the like, may be used. In one illustrative embodiment, the removal process may be performed on the basis of tetra methyl ammonium hydroxide (TMAH), which basically represents a resist stripping agent, which, however, may also efficiently remove silicon or silicon/germanium mixtures when used in higher concentrations at elevated temperatures. For example, 25 weight percent TMAH in water at approximately 80° C. provides an efficient etch agent for removing silicon material with a high degree of selectivity with respect to silicon dioxide, silicon nitride, and also titanium nitride, so that the removal process may be reliably stopped in and on the metal-containing cap layer 132. As previously explained, in some illustrative embodiments, the semiconductor material 133 may be provided in the form of a silicon material or a silicon/germanium material having a moderately high silicon content, wherein the doping level may be established on the basis of an N-type dopant species, which may provide superior etch conditions during the process 111, when using TMAH. That is, TMAH may exhibit an enhanced etch rate and an increased selectivity for N-doped silicon material compared to P-doped silicon material. Consequently, overall process reliability and uniformity may be enhanced by using N-type dopant species for adjusting the specific resistivity of the resistive structure 130C by incorporating an N-type dopant species into the material 133.

After forming the openings 133A, 133B, appropriate metal-containing materials may be formed in these openings in order to obtain highly conductive gate electrode structures for the transistors 150A, 150B, while also enabling an efficient adjustment of the threshold voltage of these transistors by using appropriate work function metals. For example, an appropriate metal-containing material may be used to obtain a desired threshold voltage for the transistor 150B, which may be accomplished by using tantalum nitride, titanium nitride and the like, wherein two or more different layers may be used, if required. Thereafter, these metals may be removed selectively from the transistor 150A, followed by the deposition of one or more metal-containing materials in order to appropriately adjust the threshold voltage of this transistor. Thereafter, a further electrode material may be deposited so as to obtain a highly conductive electrode structure. It should be appreciated, however, that any other strategy may be applied in order to individually adjust the work functions of the materials in the vicinity of the high-k dielectric layer 131. For example, a specific material may be deposited and may thereafter be locally treated so as to modify the characteristics thereof in order to obtain two different work functions.

Figure 1I:
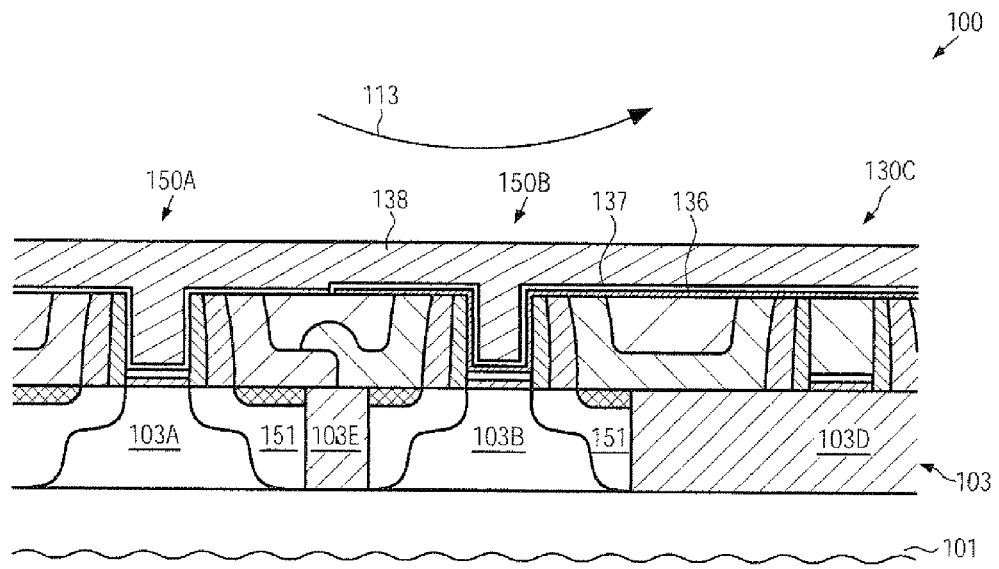

FIG. 1i schematically illustrates the semiconductor device 100 after the above-described process sequence. As illustrated, the device 100 may comprise one or more work function materials 136, which may result in a desired work function for the transistor 150B, wherein the layer 136 may comprise tantalum nitride, titanium nitride and the like. As illustrated, the layer 136 may also be formed above the resistive structure 130C, thereby avoiding exposure to an etch ambient, which may be applied in order to remove the material 136 from the transistor 150A. Moreover, a further metal-containing material 137, which may represent a work function material for the transistor 150A may be provided in the transistor 150A and on the material 136 and may also be provided above the resistive structure 130C. For instance, the material 137 may comprise titanium, aluminum and the like, wherein the transistor 150A represents an N-channel transistor and the transistor 150B represents a P-channel transistor. It should be appreciated, however, that any other appropriate combination of materials may be used, depending on the conductivity type of the transistors 150A, 150B. Moreover, an electrode metal 138, such as aluminum and the like, may be deposited so as to reliably fill the openings 133A, 133B (FIG. 1h).

The semiconductor device 100 as illustrated in FIG. 1i may be formed on the basis of a process sequence as described above, wherein it should be appreciated that additional process steps for enhancing overall process efficiency may be applied as is required. For example, after depositing the one or more layers 136, which may comprise two or more different materials, a mask material, such as a silicon dioxide material, and the like, may be deposited and may be subsequently patterned so as to cover the transistor 150B and the resistive structure 130C. For this purpose, lithography techniques may be used in combination with wet chemical etch recipes, such as hydrofluoric acid, in order to expose the transistor 150A. Thereafter, at least one sub-layer of the material 136 may be removed from the transistor 150A, for instance, on the basis of wet chemical etch recipes, followed by the removal of the corresponding mask layer above the transistor 150B and the resistive structure 130C. Thereafter, the one or more materials of the layer 137 may be deposited followed by the deposition of the layer 138. Next, as illustrated in FIG. 1i, a material removal process 113 may be applied, such as a CMP process, in order to remove excess material of the layers 138, 137, and 136.

Figure 1J:
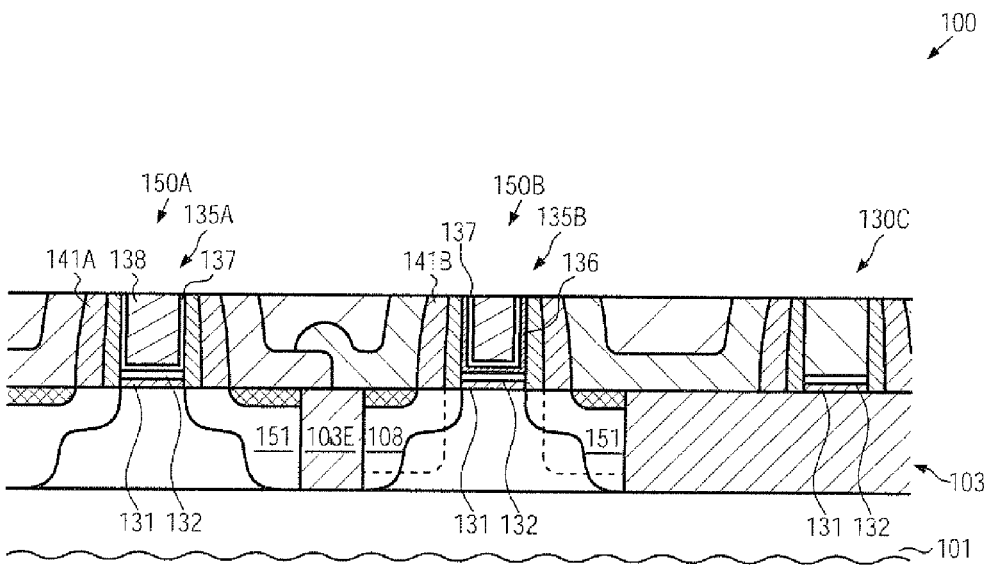

FIG. 1j schematically illustrates the semiconductor device 100 after the above-described process sequence. Consequently, the transistors 150A, 150B may comprise sophisticated gate electrode structures 135A, 135B, respectively, while the resistive structure 130C may still comprise the semiconductor material 133 (FIG. 1h). As illustrated, the gate electrode structure 135A may comprise the electrode metal 138, such as aluminum, and the metal-containing material 137 which, in combination with the cap layer 132 may result in a desired work function. Similarly, the gate electrode structure 135B may comprise materials 136 and 137 in combination with the electrode metal 138, thereby defining, in combination with the remaining cap layer 132, an appropriate work function for the transistor 150B. On the other hand, the resistive structure 130C may have a well-defined resistivity determined by the material composition of the semiconductor 133 and the dopant level contained therein and the resistivity of the cap layer 132. As previously explained, since the layer 132 may have a reduced thickness of approximately 1 to several nm, the resulting sheet resistivity may be moderately high, so that the contribution provided by the material 133 is reduced, thereby enabling an efficient adjustment of the overall resistance value of the structure 130C at a moderately low dopant level, thereby providing a high degree of controllability and uniformity of the resistance value of the structure 130C. Moreover, the transistors 150A, 150B may be formed in accordance with a manufacturing sequence which may provide desired superior transistor characteristics, for instance, by using one or more stress-inducing dielectric materials, such as the layers 141A, 141B, while, also, in one or both of the transistors 150A, 150B, a strain-inducing embedded semiconductor material, such as the semiconductor alloy 108 in the transistor 150B, may be incorporated. Consequently, any further device scaling may be accomplished on the basis of the sophisticated gate electrode structures 135A, 135B, wherein the resistive structure 130C may also be provided in a low capacitance state in an area efficient manner by avoiding the incorporation of the electrode metal 138.

Figure 1K:
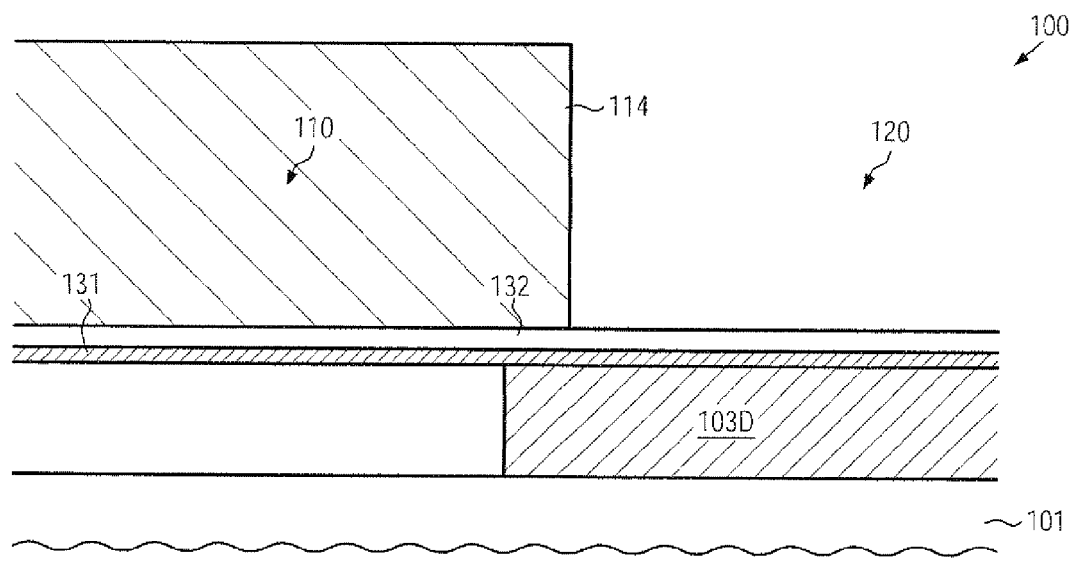
FIGS. 1k-1l schematically illustrate cross-sectional views of the semiconductor device in an early manufacturing stage, in which at least a metal-containing cap material formed on the high-k dielectric material may be selectively removed above the resistor region prior to depositing the semiconductor material, according to further illustrative embodiments.
Figure 1L:
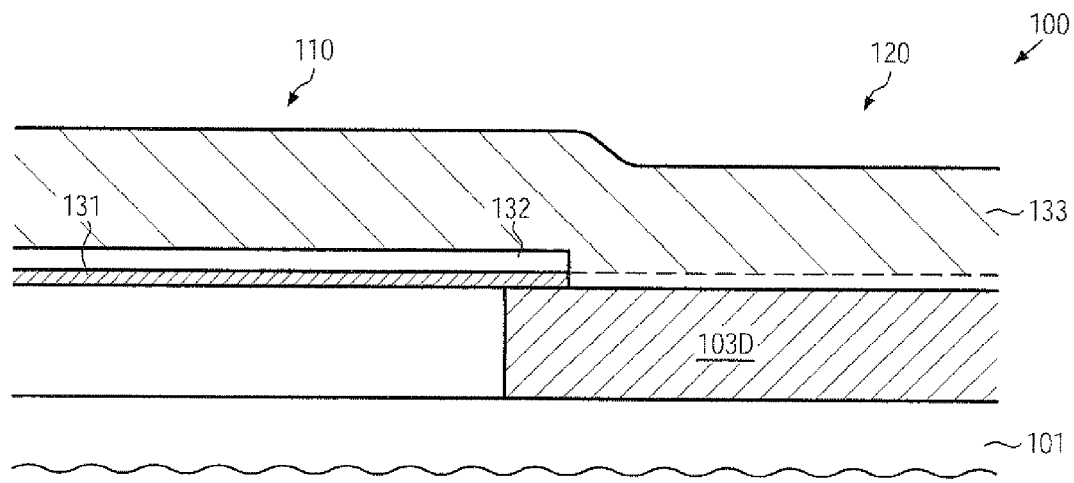

With reference to FIGS. 1k-1l, further illustrative embodiments will now be described, in which at least the metal-containing cap layer may be removed in an early manufacturing stage selectively in the resistor region, when the sheet resistance thereof is considered inappropriate for the resistive structure.

FIG. 1k schematically illustrates the semiconductor device 100 in an early manufacturing stage, in which gate dielectric layer 131 including the high-k material is deposited in combination with the metal-containing cap layer 132 above the transistor region 110 and the resistor region 120. Moreover, an etch mask 114 may be provided to cover the transistor region 110 while exposing the resist region 120 or at least a portion thereof, above which the resistive structure is to be formed. The mask 114 may be provided in the form of any appropriate material, such as a resist material, a hard mask material and the like. Thereafter, the exposed portion of at least the layer 132 may be removed by any appropriate etch recipe, such as wet chemical etch recipes and the like. In some illustrative embodiments, the material 131 may also be removed when a modification of the characteristics thereof are considered inappropriate for further processing. In other illustrative embodiments, the layer 131 may be maintained, since a corresponding modification thereof, for instance, incorporation of oxygen and the like, may be considered acceptable for the further processing and for the finally obtained characteristics of the resistive structure.

FIG. 1l schematically illustrates the semiconductor device 100 in a further advanced manufacturing stage, in which the semiconductor material 133 may be formed above the regions 110, 120, wherein at least the layer 132 is removed above the resistor region 120 or at least a significant portion thereof. With respect to the deposition of the material 133 and the adjustment of the doping level thereof, the same criteria may apply as previously explained. Furthermore, if desired, the material 133 may be planarized in order to improve surface flatness, when a difference in height between the regions 110 and 120 is considered inappropriate for the further processing. Subsequently, further process steps may be performed, as previously discussed, for instance, by depositing a cap material and patterning the resulting layer stack in order to obtain the replacement gate electrode structures and a resistive structure whose resistance value is thus completely determined by the geometry of the corresponding structure and the specific resistivity of the material 133.

As a result, the present disclosure provides semiconductor devices and manufacturing techniques in which resistive structures may be formed on the basis of a semiconductor material, such as polysilicon, above isolation structures in combination with sophisticated gate electrode structures, including high-k dielectric materials and metal-containing electrode materials. Consequently, superior packing density may be accomplished without degrading performance of resistive structures, as may conventionally be caused by incorporating the semiconductor-based resistors into the semiconductor substrate or the active semiconductor layer of SOI devices. Moreover, contrary to other conventional approaches, in which the resistive structures may be formed on the basis of a metal electrode material as used in the sophisticated gate electrode structures, according to the principles disclosed herein, the resistance value of the resistive structure may determined by the semiconductor material, i.e., by the composition and the doping level thereof, thereby reducing the parasitic capacitance without unduly consuming valuable substrate area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    a transistor element comprising a gate electrode structure that comprises a high-k gate dielectric material and a metal-containing electrode material formed above said high-k gate dielectric material; and
    a resistor formed above an isolation structure, said resistor comprising a doped semiconductor material and a layer of a metal-containing material formed on a layer of said high-k gate dielectric material.

2. The semiconductor device of claim 1, wherein said doped semiconductor material is formed on an insulating material.

3. The semiconductor device of claim 1, wherein said doped semiconductor material comprises silicon.

4. The semiconductor device of claim 1, wherein said doped semiconductor material comprises germanium.

5. The semiconductor device of claim 4, wherein a germanium content of said doped semiconductor material is approximately 10 atomic percent and higher.

6. The semiconductor device of claim 1, wherein said gate electrode structure has a gate length of approximately 50 nm or less.

7. The semiconductor device of claim 1, wherein said transistor element further comprises a strain-inducing semiconductor alloy formed in an active region of said transistor element.

8. The semiconductor device of claim 1, further comprising a second transistor element comprising a second gate electrode structure that includes said high-k gate dielectric and a second metal-containing electrode material that differs from said metal-containing electrode material.

9. The semiconductor device of claim 8, further comprising a first stress-inducing dielectric layer formed above said transistor element and a second stress-inducing dielectric layer formed above said second transistor element, wherein said first and second stress-inducing dielectric layers induce a different type of stress.

10. A semiconductor device, comprising:
    a transistor element comprising a gate electrode structure that comprises a high-k gate dielectric material and a metal-containing electrode material formed above said high-k gate dielectric material;
    a resistor formed above an isolation structure, said resistor comprising a doped semiconductor material; and
    a second transistor element comprising a second gate electrode structure that includes said high-k gate dielectric and a second metal-containing electrode material that differs from said metal-containing electrode material.

11. The semiconductor device of claim 10, further comprising a first stress-inducing dielectric layer formed above said transistor element and a second stress-inducing dielectric layer formed above said second transistor element, wherein said first and second stress-inducing dielectric layers induce a different type of stress.

12. A semiconductor device, comprising:
 a transistor element comprising a gate electrode structure that comprises a high-k gate dielectric material, a metal-containing electrode material formed above said high-k gate dielectric material and a strain-inducing semiconductor alloy formed in an active region of said transistor element; and
 a resistor formed above an isolation structure, said resistor comprising a doped semiconductor material.

* * * * *